(12) United States Patent
Ji et al.

(10) Patent No.: US 10,685,895 B2
(45) Date of Patent: Jun. 16, 2020

(54) POWER MODULE WITH LEAD COMPONENT AND MANUFACTURING METHOD THEREOF

(71) Applicant: DELTA ELECTRONICS, INC., Taoyuan (CN)

(72) Inventors: Pengkai Ji, Shanghai (CN); Shouyu Hong, Shanghai (CN); Zhenqing Zhao, Shanghai (CN); Jianhong Zeng, Shanghai (CN)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/261,012

(22) Filed: Jan. 29, 2019

(65) Prior Publication Data
US 2019/0157175 A1 May 23, 2019

Related U.S. Application Data

(62) Division of application No. 15/720,062, filed on Sep. 29, 2017, now Pat. No. 10,249,550.

(30) Foreign Application Priority Data

Oct. 28, 2016 (CN) .......................... 2016 1 0970174

(51) Int. Cl.
*H05K 1/02* (2006.01)
*H05K 5/00* (2006.01)
(Continued)

(52) U.S. Cl.
CPC ........ *H01L 23/3121* (2013.01); *H01L 21/561* (2013.01); *H01L 21/565* (2013.01);
(Continued)

(58) Field of Classification Search
CPC ... H05K 1/02; H05K 5/00; H05K 9/00; H01L 23/34; H01L 23/36; H01L 23/58;
(Continued)

(56) References Cited

U.S. PATENT DOCUMENTS 5,294,897 A * 3/1994 Notani .................... H01L 23/66
257/676
5,563,450 A * 10/1996 Bader ................ H01R 13/6485
257/678
(Continued)

FOREIGN PATENT DOCUMENTS

CN 2599818 Y 1/2004
CN 1956157 A 5/2007
(Continued)

*Primary Examiner* — Xiaoliang Chen
(74) *Attorney, Agent, or Firm* — Kirton McConkie; Evan R. Witt

(57) ABSTRACT

The present invention provides a power module and a manufacturing method thereof. The power module includes a carrier board and a lead component stacked relative to the carrier board. The lead component includes an initial plane, plural first pins and plural second pin. The initial plane includes a vertical projection overlapping with the carrier board. The first pins are electrically connected to the carrier board and vertical to the initial plane. The second pins are electrically connected to the carrier board and vertical to the initial plane. An isolation gap is disposed in the initial plane and located between the first pins and the second pins. The initial plane is separated into a first plane and a second plane by the isolation gap, so as to electrically isolate the first pins and the second pins from each other.

19 Claims, 20 Drawing Sheets

(51) Int. Cl.
| | |
|---|---|
| *H05K 9/00* | (2006.01) |
| *H01L 23/34* | (2006.01) |
| *H01L 23/36* | (2006.01) |
| *H01L 23/58* | (2006.01) |
| *H01L 23/66* | (2006.01) |
| *H01L 23/367* | (2006.01) |
| *H01L 29/82* | (2006.01) |
| *H01L 51/52* | (2006.01) |
| *H01L 23/31* | (2006.01) |
| *H01L 21/56* | (2006.01) |
| *H01L 23/433* | (2006.01) |
| *H01L 23/498* | (2006.01) |
| *H01L 23/492* | (2006.01) |
| *H05K 1/11* | (2006.01) |
| *H05K 1/18* | (2006.01) |
| *H05K 3/30* | (2006.01) |
| *H05K 3/40* | (2006.01) |

(52) U.S. Cl.
CPC ........ *H01L 23/4334* (2013.01); *H01L 23/492* (2013.01); *H01L 23/49811* (2013.01); *H05K 1/02* (2013.01); *H05K 1/11* (2013.01); *H05K 1/18* (2013.01); *H05K 3/30* (2013.01); *H05K 3/40* (2013.01); *H05K 1/0265* (2013.01); *H05K 2201/10272* (2013.01)

(58) Field of Classification Search
CPC ....... H01L 23/66; H01L 23/367; H01L 29/82; H01L 51/52
USPC .......... 361/760, 704, 707, 800; 257/40, 414, 257/678, 723, 785
See application file for complete search history.

(56) References Cited

U.S. PATENT DOCUMENTS

| | | | | |
|---|---|---|---|---|
| 5,754,402 | A | * | 5/1998 | Matsuzaki .............. H01L 23/36 361/707 |
| 5,917,708 | A | * | 6/1999 | Moran ................. H05K 9/0032 174/372 |
| 6,005,773 | A | | 12/1999 | Rozman et al. |
| 6,320,748 | B1 | * | 11/2001 | Roden ................... H01L 23/367 165/185 |
| 2007/0210392 | A1 | * | 9/2007 | Sakakibara ............. B81B 7/007 257/414 |
| 2015/0171362 | A1 | * | 6/2015 | Sato .................... H01L 51/5203 257/40 |

FOREIGN PATENT DOCUMENTS

| | | |
|---|---|---|
| CN | 102592803 A | 7/2012 |
| CN | 102790513 A | 11/2012 |
| CN | 102903693 A | 1/2013 |
| CN | 104980003 A | 10/2015 |
| CN | 105990266 A | 10/2016 |
| TW | 201036011 A | 10/2010 |

* cited by examiner

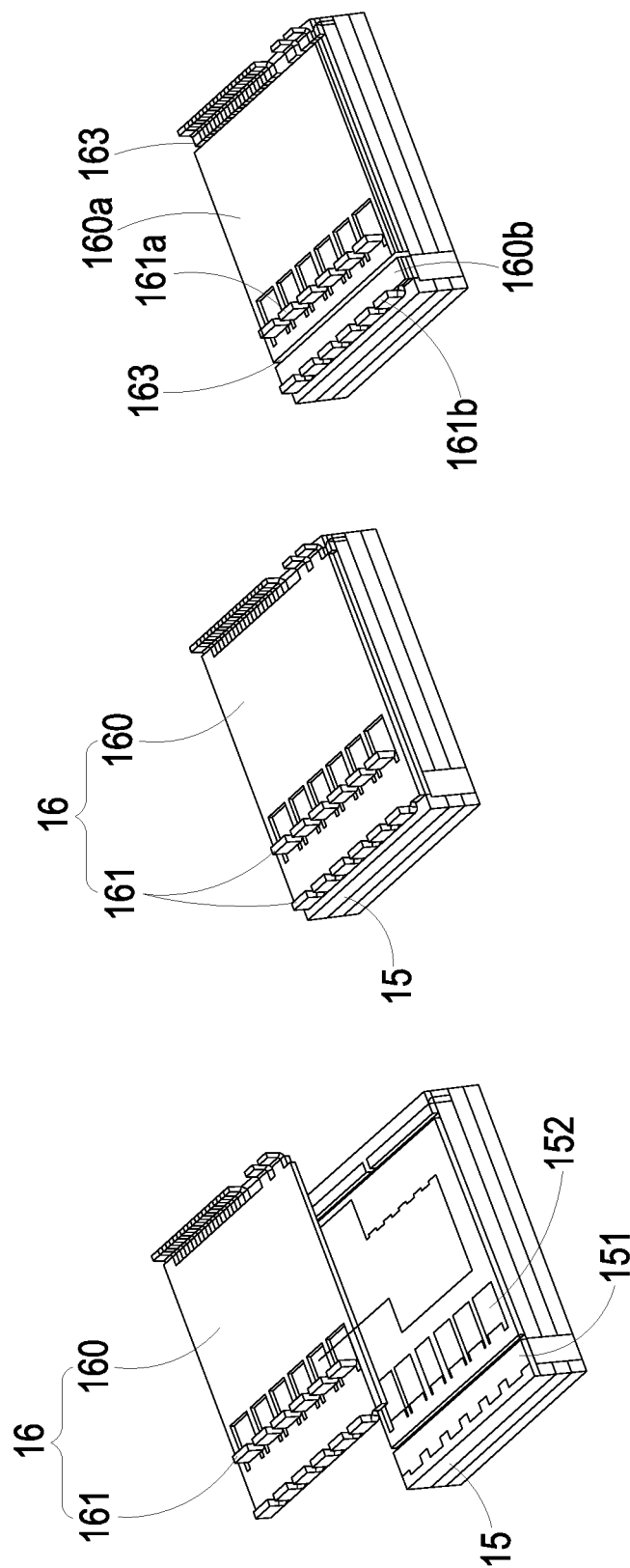

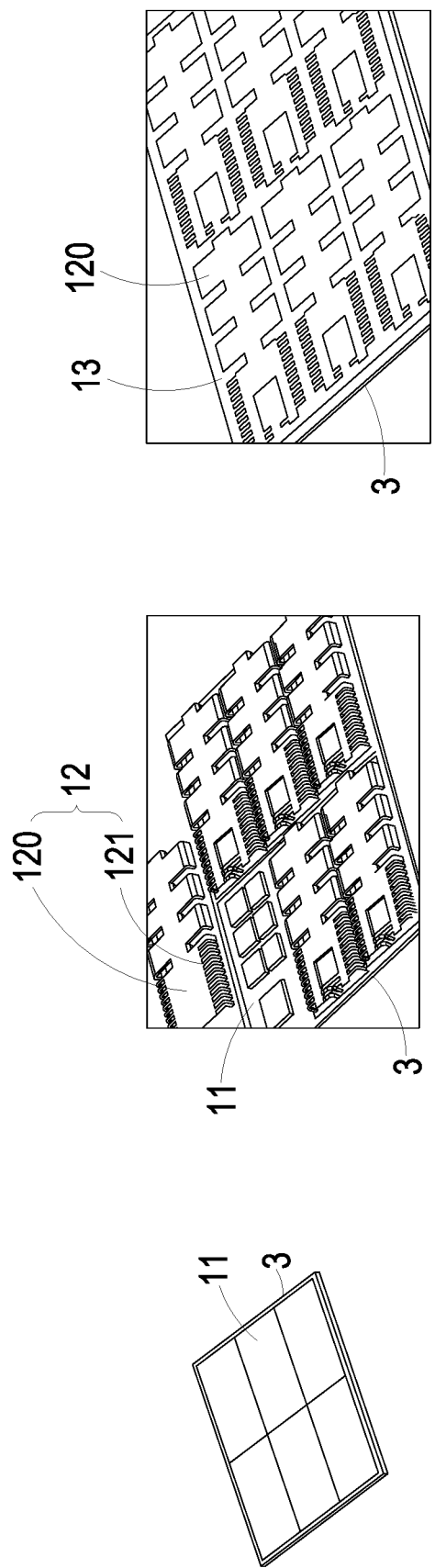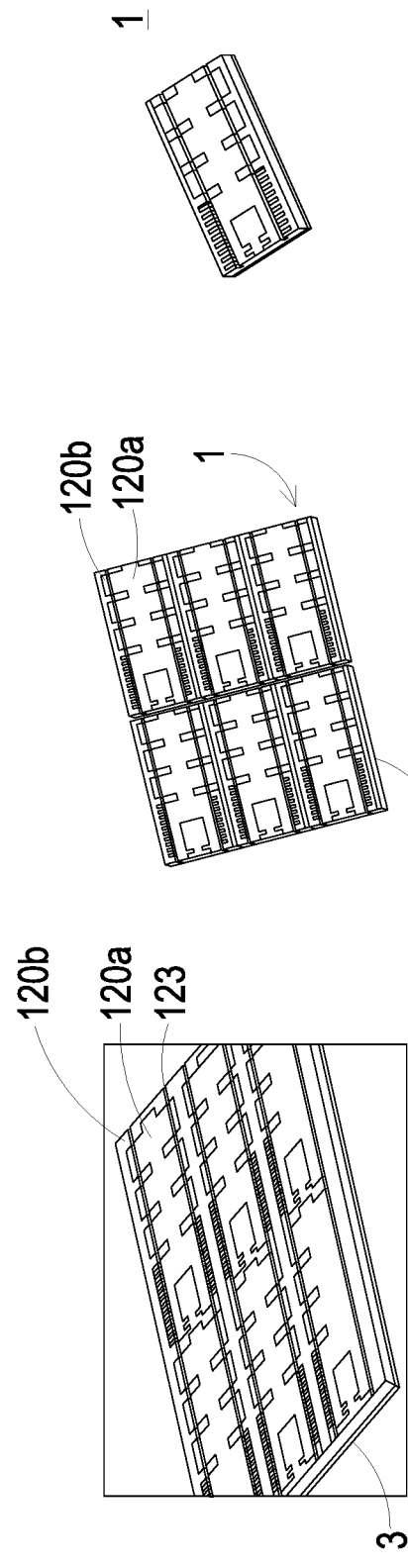

POWER MODULE WITH LEAD COMPONENT AND MANUFACTURING METHOD THEREOF

CROSS-REFERENCE TO RELATED APPLICATION

This application is a Divisional Application of U.S. patent application Ser. No. 15/720,062 filed on Sep. 29, 2017, and entitled "POWER MODULE WITH LEAD COMPONENT AND MANUFACTURING METHOD THEREOF", the entirety of which is hereby incorporated by reference for all purposes.

FIELD OF THE INVENTION

The present invention relates to a power module, and more particularly to a power module having a lead component and a manufacturing method thereof.

BACKGROUND OF THE INVENTION

In the conventional art, a switching power supply is often used to solve the problem of low conversion efficiency of the power system. However, the circuit topology of the switching power supply is complex, so that the integrated density can't be effectively improved. In order to minimize size and improve efficiency and application flexibility, the conventional power module has a leadframe to lead out the pin. The leadframe is used as the carrier of the integrated circuit chip, and the electrical connection between the output terminal of the chip and the outer leading wire is implemented by wire bonding. Consequently, the small terminal of the semiconductor chip is converted into the large-size output pin for facilitating the power module to assemble onto electronic devices or circuit boards.

Generally, the conventional lead frames are fabricated by means of precision stamping or etching, and integrated by leads and frames. The frame is a carrier to support the leads. When the lead is fixed with the chip or power module, the frame is cut off, and then the exposed portion of the lead is subjected to the necessary forming process to produce the pin as final shape. If the leadframe of the power module is used as the pin, the power density of the power module can be improved. However, the leading terminal of the leadframe can only be led out at the edge of the printed circuit board and the printed circuit board should have a trace for further conduction, so as to increase the trace load on the printed circuit board and the power loss. Furthermore, the leading terminal of the leadframe tends to be led out from the outside of the final forming module, and the package footprint of the module is increased. In addition, if the power module uses a leadframe to lead out the pin of the surface-mount technology (SMT), the final formation of the pin pad area is small, so that it is unfavourable to be applied by the customers and reduce the loss of solder joints. On the other hand, after the forming process of the leadframe, the frame part will be cut off and the material is wasted. Further due to the existence of the frame, the entire area of the leadframe is larger, and the cost is increased. When the power module having the leadframe is introduced to a molding process, the molding tools need to avoid the leadframe or match with the leadframe so as to form a sealed molding chamber. Thus, the complexity and the volume of the molding tools are increased, and the possibility of developing general molding tools is reduced.

In view of the foregoing problem, there is a power module having leading terminals, which are directly led out from the printed circuit board. Although the leading terminals of the power module can be arranged at any positions in the package of the power module, additional devices can't be arranged on the side of the printed circuit board with the lead-out terminals, so that the utilization of the printed circuit board will be reduced, the footprint of the module will increase, or the power loss will be increased because a detour-type routing is implemented to add other devices.

There are some power modules provided with plastic molding, the entire module with plastic molding has leading terminals implemented by means of vias and surface metallic coating similar to those of the printed circuit board. However, the surface metallic coating can't obtain a thick metal layer, and it will influence the efficiency while the power module is applied for a high current power conversion. At the same time, it is difficult to plate metal in the deep holes, so that it is difficult to lead out the leading terminals from the inner portion of the printed circuit board. Consequently, the leading terminals are led out from the edge of the printed circuit board with plastic molding, the traces of the printed circuit board are led to the edge, and then the trace load and the power loss are increased.

Although the requirements of the efficiency and the power density of power modules are increased, the prior power modules fail to provide a leading way to meet the requirements. Therefore, there is a need of providing a power module having a lead component and a manufacturing method thereof to overcome the above drawbacks.

SUMMARY OF THE INVENTION

An object of the present invention is to provide a power module having a lead component and a manufacturing method thereof. The lead component is disposed on the carrier board, and the magnetic component and electronic device are vertically stacked relative to the lead component so as to accomplish a high-density integration of the power module and reduce the footprint and the entire volume of the power module effectively. In addition, the lead component provides not only the leading and pad functions to reduce the trace of the carrier board, but also the mechanical structural supporting function for the power module, to simplify the manufacturing process of the power module and improve the packaged structure of the power module.

Another object of the present invention is to provide a power module having a lead component and a manufacturing method thereof. By means of cutting the lead component to form an electrical isolation, the lead component provides a structure for the winding of the magnetic component and another structure for the pin of the power module, so as to accomplish a high-density integration of the power module and reduce the footprint and the entire volume of the power module effectively. The magnetic component includes a passing-through window disposed between the top and the bottom surfaces thereof, so that the winding of the magnetic component can be electrically connected to the electronic device on the carrier board in the shortest distance. Consequently, the conducting circuit is improved effectively and the conduction loss is reduced.

It is a further object of the present invention to provide a power module having a lead component and a manufacturing method thereof. The structure of the lead component is compact and the power modules having different sizes can be encapsulated by a molding tool having a common molding chamber, so as to save the costs of molding tools and the production effectively. In addition, plural lead components can be integrated for facilitating to perform the molding processing, and plural power modules can be obtained by performing at least one cutting process. Consequently, the production process is simplified, the production cost is reduced, and it is easy to achieve mass production.

In accordance with an aspect of the present invention, a power module is provided. The power module includes a carrier board and at least one lead component stacked and disposed on the carrier board. The lead component includes at least one initial plane, at least one first pin, at least one second pin and at least one isolation gap. The initial plane includes at least one pad, and a vertical projection at least partially overlapping with the carrier board. The first pin is electrically connected to the carrier board, and the first pin is vertical to the initial plane. The second pin is electrically connected to the carrier board, and the second pin is vertical to the initial plane. The isolation gap is disposed in the initial plane and located between the first pin and the second pin. The initial plane is separated into a first plane and a second plane by the isolation gap, so as to electrically isolate the first pin and the second pin from each other.

In accordance with another aspect of the present invention, a manufacturing method of a power module is provided. The manufacturing method includes steps of (a) providing a carrier board and at least one lead component, wherein the lead component comprises at least one initial plane and plural pins; (b) stacking and disposing the lead component on the carrier board, wherein a vertical projection of the initial plane at least partially overlaps with the carrier board; and (c) forming at least one isolation gap to separate the initial plane into a first plane and a second plane and divide the plural pins into at least one first pin and at least one second pin, wherein the first pin and the second pin are electrically isolated from each other, the first pin is electrically connected to the first plane, and the second pin is electrically connected to the second plane.

In accordance with other aspect of the present invention, a manufacturing method of a power module is provided. The manufacturing method includes steps of (a) providing a panel and plural lead components, wherein the panel includes plural carrier boards arranged in an array, and each lead component comprise at least one initial plane and plural pins; (b) stacking and disposing the lead components on the corresponding carrier boards in an array arrangement, wherein a vertical projection of the initial plane of each lead component at least partially overlaps with the corresponding carrier board; (c) forming at least one isolation gap to separate the initial plane of each lead component in the array arrangement into at least one first plane and at least two second plane and divide the pins of each lead component into at least one first pin and at least one second pin, wherein the first pin and the second pin are electrically isolated from each other, the first pin is electrically connected to the first plane, and the second pin is electrically connected to the second plane; and (d) cutting the panel to form plural power modules.

In accordance with other aspect of the present invention, a lead component applied to a power module is provided. The power module includes a carrier board, the lead component and at least one isolation gap, and the lead component is stacked and disposed on the carrier board. The lead component includes at least one initial plane, at least one first pin and at least one second pin. The initial plane includes at least one pad, and the initial plane includes a vertical projection at least partially overlapping with the carrier board. The first pin is electrically connected to the carrier board and vertical to the initial plane. The second pin is electrically connected to the carrier board and vertical to the initial plane. The isolation gap is located between the first pin and the second pin. The initial plane is separated into a first plane and a second plane by the isolation gap, so as to electrically isolate the first pin and the second pin from each other.

BRIEF DESCRIPTION OF THE DRAWINGS

FIGS. 10A to 10C are schematic views illustrating an assembling flow of a power module according to a sixth preferred embodiment of the present invention;

FIGS. 11A to 11F are schematic views illustrating an assembling flow of a power module according to a seventh preferred embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figures 1A, 1B, 1C:
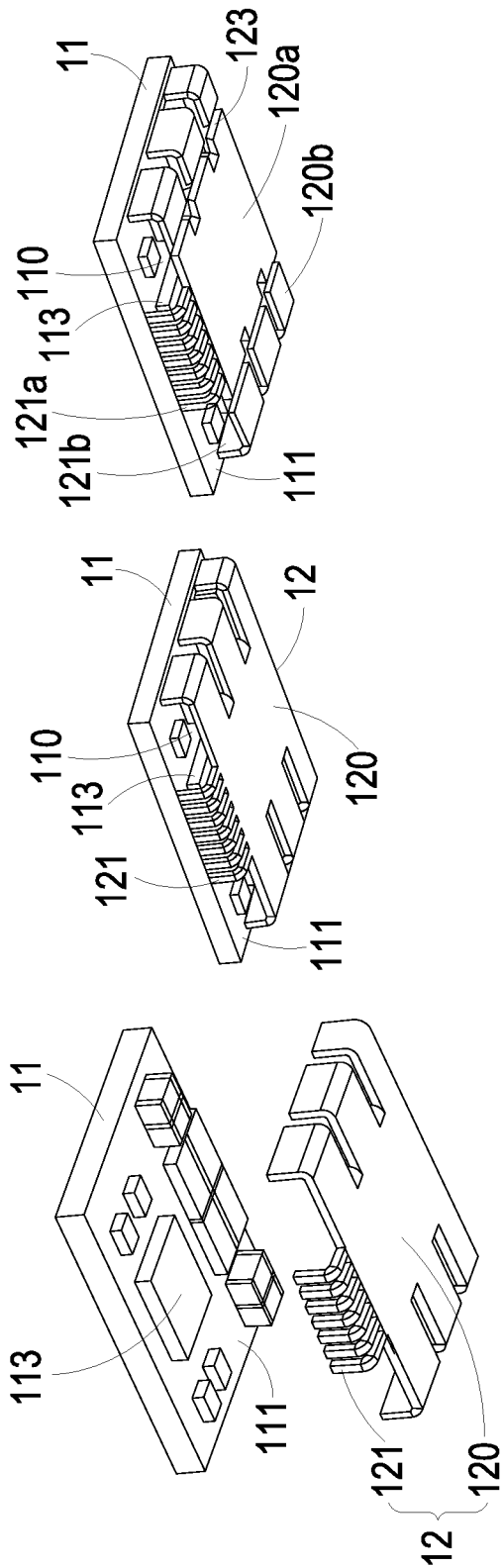
FIGS. 1A to 1C are schematic views illustrating an assembling flow of a power module according to a first preferred embodiment of the present invention.
Figure 2B:
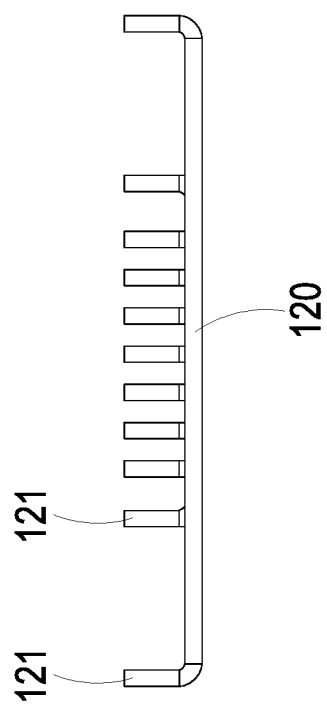
FIGS. 2A and 2B are a perspective view and a lateral view respectively illustrating the lead component of FIG. 1A.
Figure 2A:
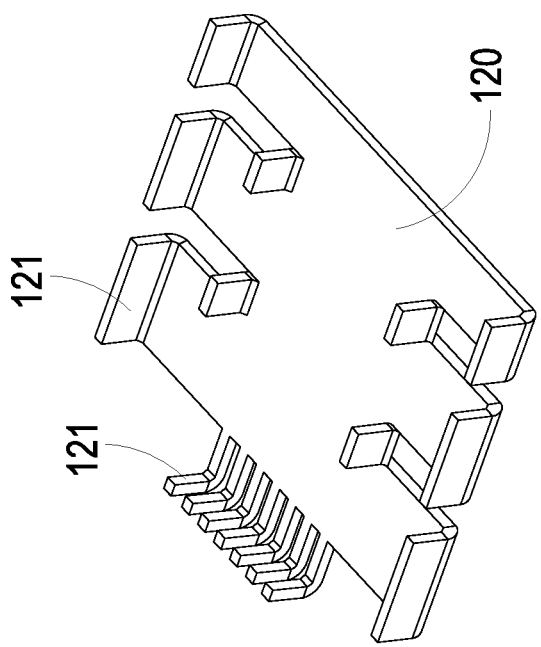
Figure 3:
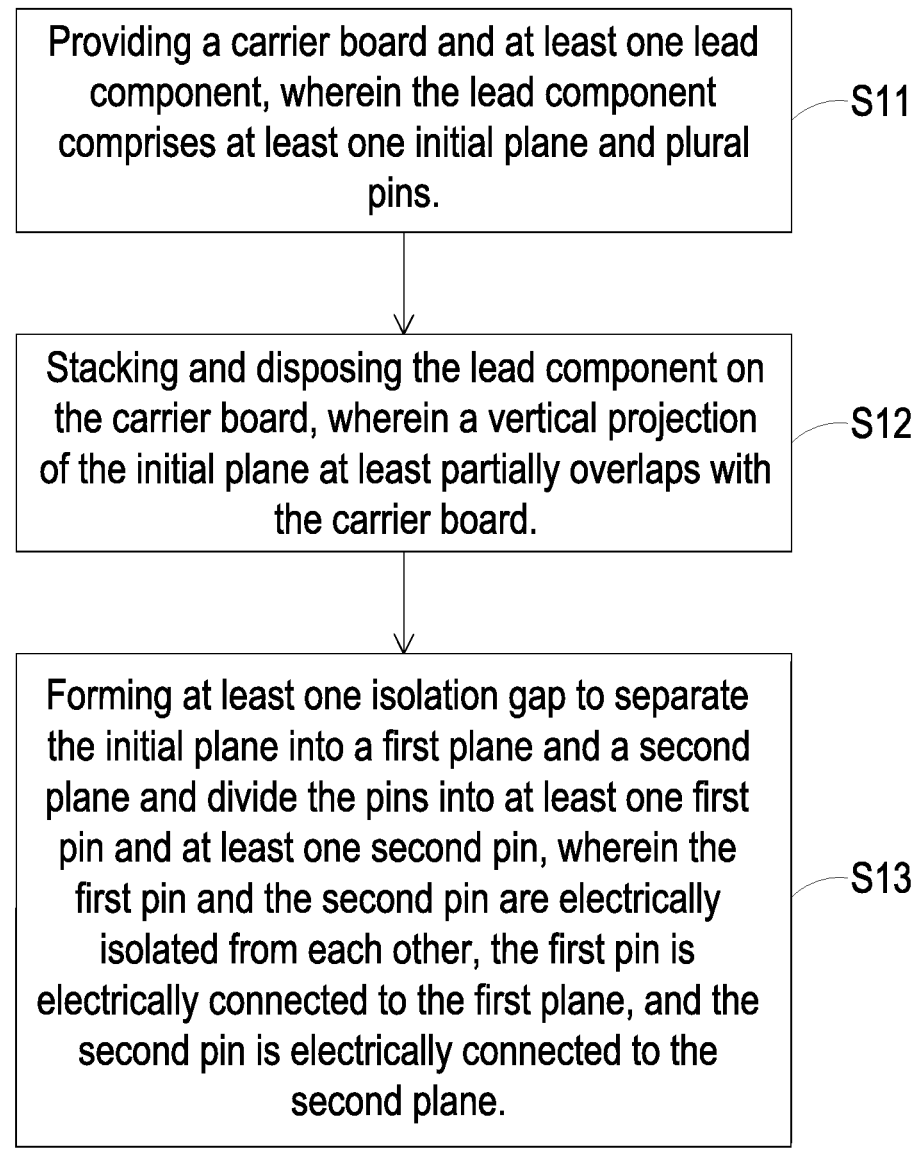
FIG. 3 is a flow chart showing a manufacturing method of a power module according to a first preferred embodiment of the present invention.

FIGS. 1A to 1C are schematic views illustrating an assembling flow of a power module according to a first preferred embodiment of the present invention. FIGS. 2A and 2B are a perspective view and a lateral view respectively illustrating the lead component of FIG. 1A. FIG. 3 is a flow chart showing a manufacturing method of a power module according to a first preferred embodiment of the present invention. As shown in FIGS. 1A to 1C, the power module 1 includes a carrier board 11 and at least one first lead component 12. The manufacturing method includes the following steps described in detail. Firstly, as shown in step S11 of FIG. 3, a carrier board 11 and at least one first lead component 12 are provided. The first lead component 12 includes at least one initial plane 120 and plural pins 121, as shown in FIGS. 2A and 2B. In addition, an electronic device 113, for example but not limited to a power device, is disposed on the first surface 111 of the carrier board 11, as shown in FIG. 1A. Then, as shown in the step S12 of FIG. 3, the first lead component 12 is stacked and disposed on the carrier board 11 by means of but not limited to welding, plugging, plastic packaging or glue-bonding. A vertical projections of the initial plane 120 at least partially overlaps with the carrier board 11. At the same time, a receiving space 110 is established between the first lead component 12 and the carrier board 11. The electronic device 113 such as a power device is accommodated in the above receiving space 110, as shown in FIG. 1B. Finally, as shown in step S13 of FIG. 3, at least one isolation gap 123 is formed on the first lead component 12 by for example but not limited to mechanical cutting, milling or etching. The initial plane 120 of the first lead component 12 is separated into at least one first plane 120a and at least one second plane 120b, and plural pins 121 are divided into at least one first pin 121a and at least one second pin 121b, so that the first pin 121a is electrically isolated from the second pin 121b. Moreover, the first pin 121a is electrically connected to the first plane 120a and the second pin 121b is electrically connected to the second plane 120b. The vertical projection of the initial plane 120 is included in a maximum circular envelope formed by the first pin 121a and the second pin 121b. The called maximum circular envelope formed by the first lead 121a and the second lead 121b means that the largest circle is selected from all circles coinciding with at least three of the first pins 121a and the second pins 121b.

Figure 4B:
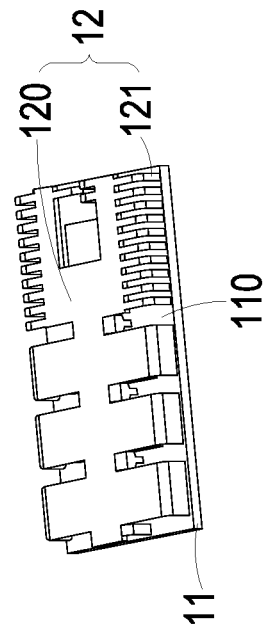
FIGS. 4A to 4D are schematic views illustrating an assembling flow of a power module according to a second preferred embodiment of the present invention.
Figure 4A:
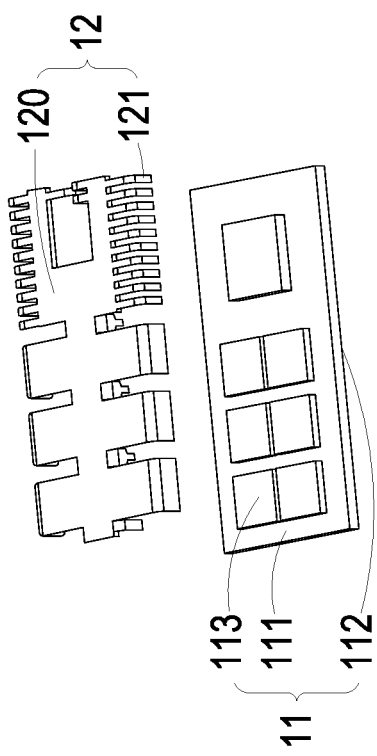
Figure 4D:
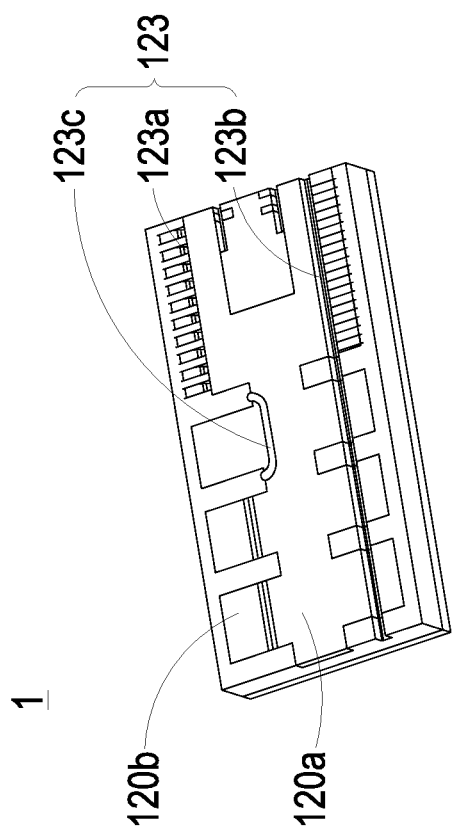
Figure 4C:
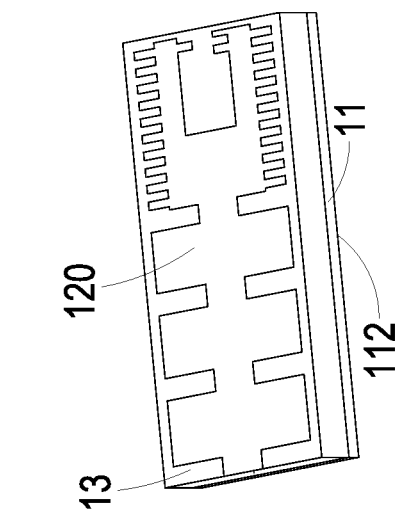
Figure 5:
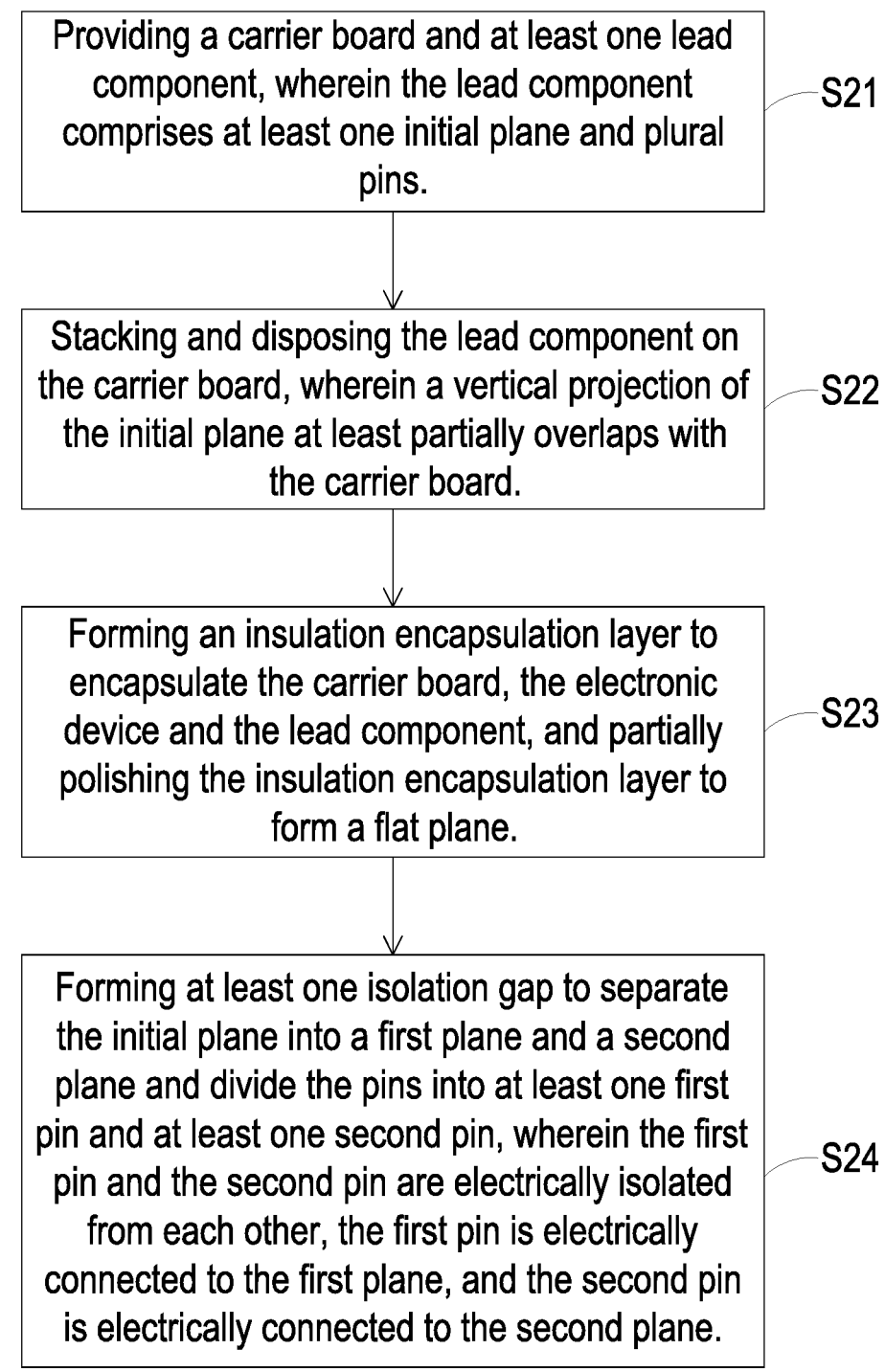
FIG. 5 is a flow chart showing a manufacturing method of a power module according to a second preferred embodiment of the present invention.
Figure 6B:
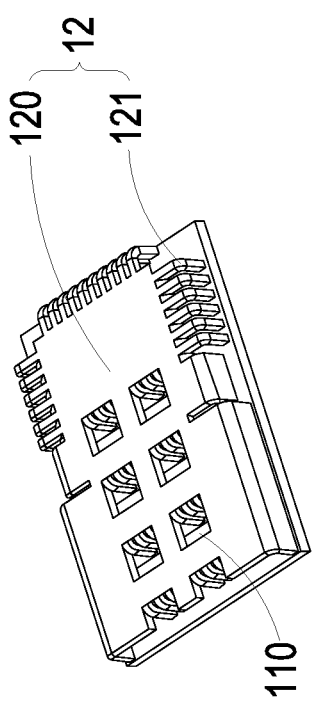
FIGS. 6A to 6D are schematic views illustrating an assembling flow of a power module according to a third preferred embodiment of the present invention.
Figure 6A:
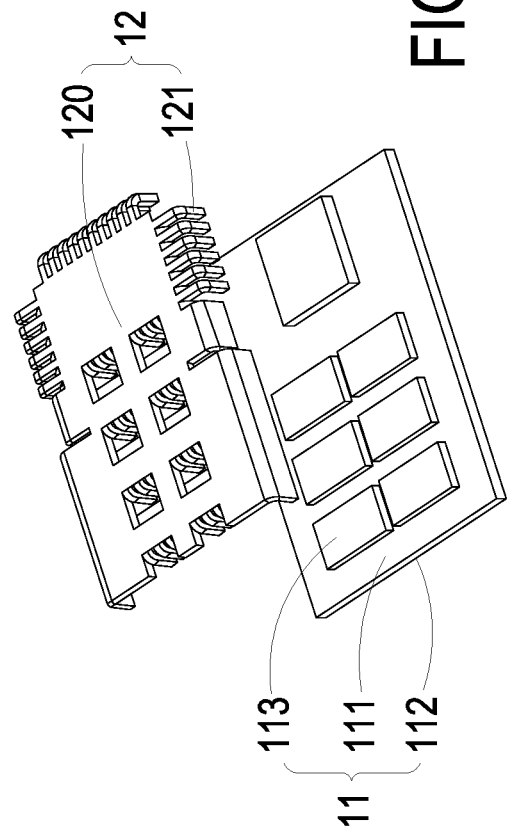
Figure 6D:
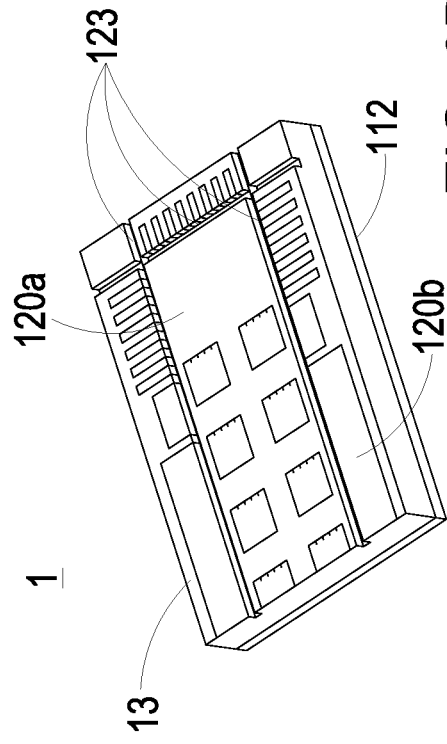
Figure 6C:
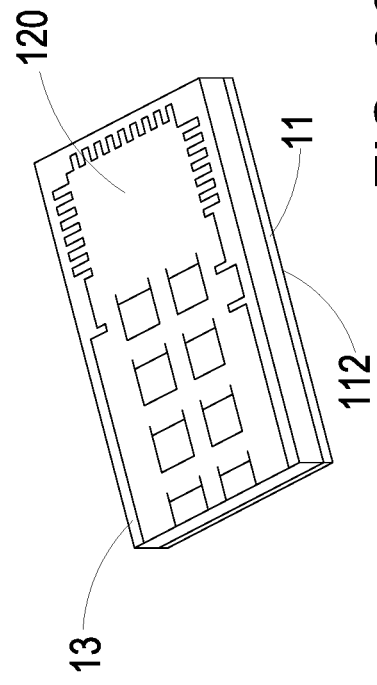

FIGS. 4A to 4D are schematic views illustrating an assembling flow of a power module according to a second preferred embodiment of the present invention. FIG. 5 is a flow chart showing a manufacturing method of a power module according to a second preferred embodiment of the present invention. In the embodiment, the structures, elements and functions of the power module 1 are similar to those of the power module 1 in FIGS. 1A to 1C, and are not redundantly described herein. As shown in FIGS. 4A to 4D and FIG. 5, the manufacturing method includes the following steps described in detail. Firstly, as shown in step S21 of FIG. 5, a carrier board 11 and at least one first lead component 12 are provided. The first lead component 12, as shown in FIG. 4A, includes at least one initial plane 120 and plural pins 121. An electronic device 113 for example but not limited to a power device is disposed on the first surface 111 of the carrier board 11. Then, as shown in step S22 of FIG. 5, the first lead component 12 is stacked and disposed on the carrier board 11 by means of but not limited to welding, plugging, plastic packaging or glue-bonding, and the vertical projection of the initial plane 120 at least partially overlaps with the carrier board 11. A receiving space 110 is formed between the first lead component 12 and the carrier board 11. The electronic device 113 such as a power device is accommodated in the above receiving space 110, as shown in FIG. 4B. Afterward, as shown in step S23 of FIG. 5, an insulation encapsulation layer 13 is formed by means of filling plastic molding material into the receiving space 110, and the carrier board 11 and the first lead component 12 are integrally molded into one piece so as to improve the structural stability. Consequently, the mechanical strength of the first lead component 12 can be retained after being cut apart, and the electronic device 113 such as a power device on the carrier board 11 is prevented from being contaminated by impurities generated in the subsequent process. In this step, the insulation encapsulation layer 13 is formed to completely encapsulate the carrier board 11, the first lead component 12 and the electronic device 113 such as the power device, and then the insulation encapsulation layer 13 is further polished or laser-deflashing to expose at least portion of the initial plane 120 of the first lead component 12, and form a flat plane having the initial plane 120 exposed thereon. It is noted that the second surface 112 on another side of the carrier board 11 can be planarized or other plated, in addition to the polishing of the insulation encapsulation layer 13 on the first lead component 12 after molding. The present invention is not limited thereto and are not redundantly described herein. Finally, as shown in step S24 of FIG. 5, at least one isolation gap 123 is formed on the insulation encapsulation layer 13 and the first lead component 12 by means of for example but not limited to mechanical cutting, milling or etching, etc., and the initial plane 120 of the first lead component 12 is separated into at least one first plane 120a and at least one second plane 120b, and the pins 121 are divided into at least one first pin 121a and at least one second pin 121b, so that the first pin 121a is electrically isolated from the second pin 121b. The first pin 121a is electrically connected to the first plane 120a, and the second pin 121b is electrically connected to the second plane 120b (see FIG. 1C). It is noted that the isolation gaps 123 of FIG. 4D includes the isolation gap 123a formed by means of etching, the isolation gap 123b formed by means of cutting, and the isolation gap 123c formed by means of milling. Therefore, the isolation gaps 123 of the present invention can be formed by different forming methods according to the practical requirements, and it is not limited thereto.

FIGS. 6A to 6D are schematic views illustrating an assembling flow of a power module according to a third preferred embodiment of the present invention. In the embodiment, the structures, elements and functions of the power module 1 are similar to those of the power module 1 in FIGS. 4A to 4D, and are not redundantly described herein. In the embodiment, the manufacturing method includes the similar steps as the steps S21 to S24 of FIG. 5, but at the step 24, the isolation gaps 123 can be obtained only by means of mechanical cutting while the lead component 12 is well designed in advance. In the embodiment, the initial plane 120 of the first lead component 12 is separated into a central large region of the first plane 120a configured as an electrical ground (GND) pad of the power module 1, and lateral and peripheral regions of the second plane 120b configured as an output voltage (Vo) pad, an input voltage (Vin) pad, and a signal (Signals) pad of the power module 1, so as to provide external connection pads. Certainly, in the embodiment, the arrangement of the first plane 120a and the second plane 120b is only illustrative, and the present invention is not limited thereto. Similarly, FIGS. 7A to 7D are schematic views illustrating an assembling flow of a power module according to a fourth preferred embodiment of the present invention. In the embodiment, the structures, elements and functions of the power module 1 are similar to those of the power module 1 in FIGS. 4A to 4D, and are not redundantly described herein. In the present embodiment, the manufacturing method includes the similar steps as the steps S21 to S24 of FIG. 5, but at the step 24, the isolation gaps 123 can be obtained by means of etching or milling, so as to compact and accommodate more pins of the power module 1. The initial plane 120 of the first lead component 12 is separated into a central large region of the first plane 120a configured as an electrical ground (GND) pad of the power module 1, and lateral and peripheral regions of the second plane 120b configured as an output voltage (Vo) pad, an input voltage (Vin) pad, and a signal (Signals) pad of the power module 1, so as to provide external connection pads. Certainly, in the embodiment, the arrangement of the first plane 120a and the second plane 120b is only illustrative, and the present invention is not limited thereto. It is noted that leading pad (not shown) can be formed on a second surface 112 disposed on another side of the carrier board 11, so as to increase the variability of leading distribution in the power module 1. Certainly, the present invention is not limited thereto, and are not redundantly described herein.

Figure 8A:
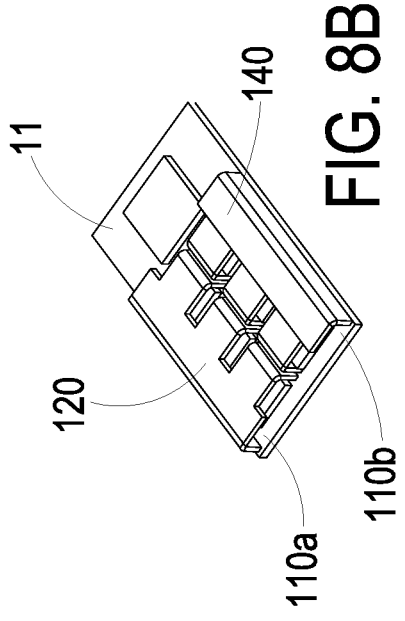
FIGS. 8A to 8D are schematic views illustrating an assembling flow of a power module according to a fifth preferred embodiment of the present invention.
Figure 8B:
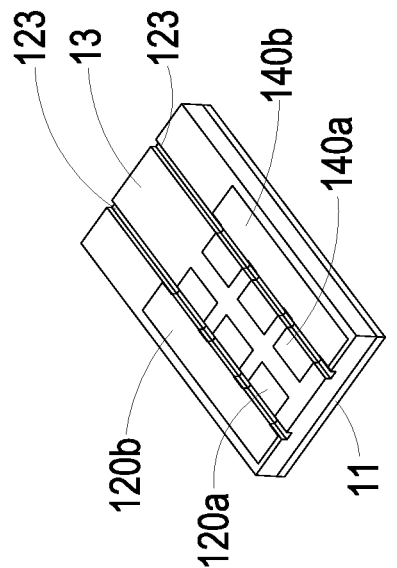
Figure 8C:
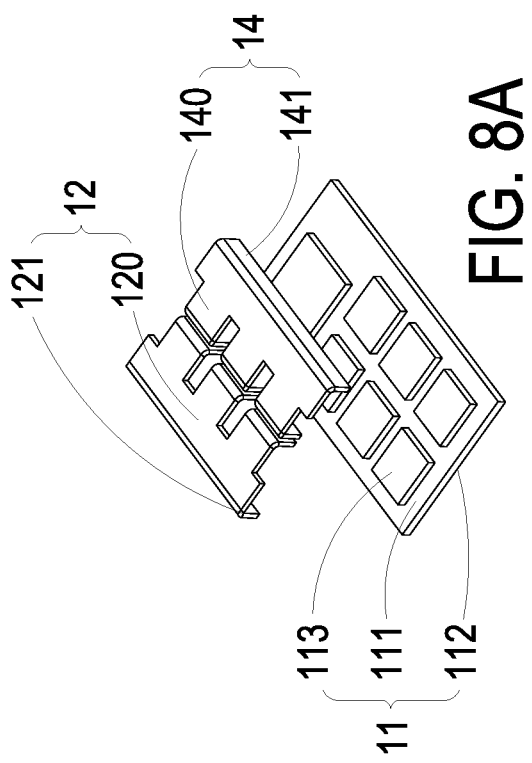
Figure 8D:
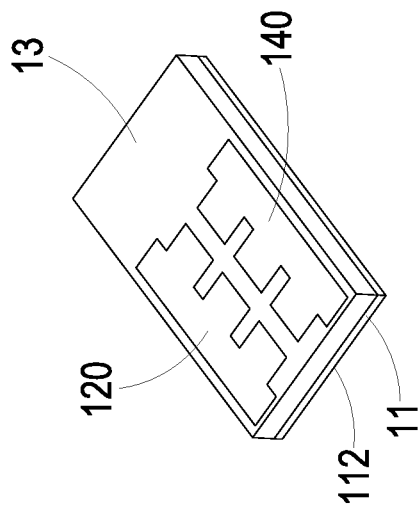

FIGS. 8A to 8D are schematic views illustrating an assembling flow of a power module according to a fifth preferred embodiment of the present invention. In the embodiment, the structures, elements and functions of the power module 1 are similar to those of the power module 1 in FIGS. 4A to 4D, and are not redundantly described herein. Different from the power module 1 of FIGS. 4A to 4D, the power module 1 of this embodiment further includes not only a carrier board 11 and a first lead component 12, but also a second lead component 14. The first lead component 12 and the second lead component 14 are shown in FIG. 8A. The first lead component 12 includes at least one first initial plane 120 and plural pins 121. The second lead component 14 includes at least one second initial plane 140 and plural pins 141. An electronic device 113 for example but not limited to a power device is disposed on the first surface 111 of the carrier board 11. Secondly, as shown in FIG. 8B, the first lead component 12 and the second lead component 14 are stacked and disposed on the carrier board 11 by means of but not limited to welding, plugging, plastic packaging or glue-bonding. The vertical projection of the first initial plane 120 and the second initial plane 140 at least partially overlap with the carrier board 11. In addition, the first lead component 12 and the second lead component 14 are configured to form receiving spaces 110a and 110b with the carrier board 11, respectively. The electronic devices 113 such as power devices are accommodated in the receiving spaces 110a and 110b formed as described above. Then, as shown in FIG. 8C, an insulation encapsulation layer 13 is formed by means of filling plastic molding material to encapsulate the carrier board 11, the first lead component 12 and the second component 14 into one piece so as to improve the structural stability. Moreover, the mechanical strength of the first lead component 12 the second lead component 14 can be retained after being cut apart, and the electronic device 113 such as a power device on the carrier board 11 is prevented from being contaminated by impurities generated in the subsequent process. In an embodiment, the surface of the insulation encapsulation layer 13 can be polished or laser-deflashing to make the first initial plane 120 and the second initial plane 140 form a flat plane, but it is not limited thereto. Finally, as shown in FIG. 8D, plural isolation gaps 123 are formed on the insulation encapsulation layer 13, the first lead component 12, and the second lead component 14 by means of for example but not limited to mechanical cutting, milling or etching. At the same time, the first lead component 12 is divided into at least one first plane 120a and at least one second plane 120b, and the second lead component 14 is divided into at least one third plane 140a and at least one fourth plane 140b, so as to provide soldering pads for different functions. It should be noted that in the foregoing embodiments, the number of the lead components disposed on the carrier board is adjustable according to the practical requirement, so that the power module 1 of the present invention has more flexible leading distribution. The present invention is not limited thereto, and are not redundantly described herein.

Figure 9B:
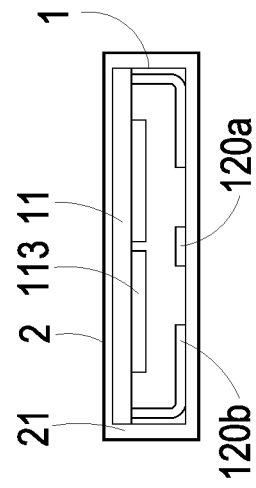
FIGS. 9A and 9B are front and side cross-sectional views illustrating a power module and a plastic molding tool according to a preferred embodiment of the present invention.
Figure 9A:
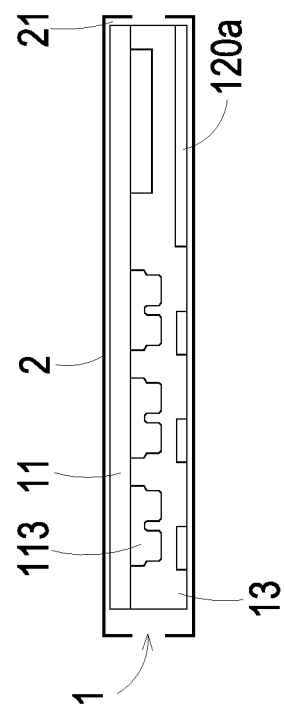
Figure 9C:
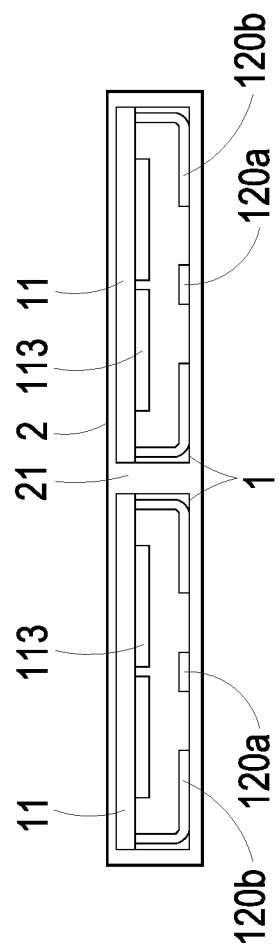
FIG. 9C is a side cross-sectional view illustrating power modules and a plastic molding tool according to another preferred embodiment of the present invention.

With the foregoing embodiments, it is understood that the power module 1 of the present embodiment includes the first lead component 12 or the second lead component 14 to configure with the carrier board 11, so that the varieties of the leading-out distribution from the carrier board 11 is more flexible, and the power current burden and loss of the carrier board 11 can be reduced effectively. It is easy to accomplish the power module having a multi-phase output current with good symmetry, consistency and current sharing. In addition, the first lead component 12 or the second lead component 14 is cut to form the plane with a larger area, such as the first plane 120a of FIGS. 4D, 5D and 6D or the second plane 120b and the fourth plane 140b, so as to facilitate for grounding application and heat dissipation. In some embodiments, the carrier board 11 can be a printed circuit board, and the first lead component 12 or the second lead component 14 are made of a copper material. Since the printed circuit board and the copper material have similar thermal expansion coefficients in a direction parallel to the surface of the carrier board 11, the stress balance and reliability of the power module 1 can be enhanced effectively. Further, the power module 1 of the present invention includes the carrier board 11 stacked with the first lead component 12 or the second lead component 14 together, so that it is easy to simplify the design of the molding tools. FIGS. 9A and 9B are front and side cross-sectional views illustrating a power module and an EMC (Epoxy Molding Compound) molding tool according to a preferred embodiment of the present invention. As shown in FIGS. 9A and 9B, the plastic molding tool 2 applied to encapsulate the power module 1 of the present invention includes an inner molding chamber 21, which can be a simple rectangle. The plastic molding of the power module 1 can be accomplished by utilizing the molding chamber 21 in rectangular shape. Consequently, the compact design of the molding tool can reduce the cost, and a common molding tool can be utilized to encapsulate several combinations with different sizes. FIG. 9C is a side cross-sectional view illustrating power modules and a plastic molding tool according to another preferred embodiment of the present invention. Since the molding chamber 21 of the plastic molding tool 2 can accommodate plural power modules 1 for plastic molding, the efficiency of plastic molding is enhanced.

FIGS. 10A to 10C are schematic views illustrating an assembling flow of a power module according to a sixth preferred embodiment of the present invention. In the embodiment, the power module 1 includes a carrier board 15 having its packaged structure formed by surface mount technology (SMT) and at least one first lead component 16. Plural conductive pads 152 are disposed on the first surface 151 of the carrier board 15. The first lead component 16 includes an initial plane 160 and plural pins 161 corresponding to the conductive pads 152, as shown in FIG. 10A. The initial plane 160 of the first lead component 16 is then attached to the first surface 151 of the carrier board 15, and the pins 161 are corresponding to the conductive pads 152 on the carrier board 15 as shown in FIG. 10B. Finally, at least one isolation gap 163 is formed on the first lead component 16 by means of for example but not limited to mechanical cutting, milling or etching. The preformed initial plane 160 of the first lead component 16 is separated into at least one first plane 160a and at least one second plane 160b, and the pins 161 are divided into at least one first pin 161a and at least one second pin 161b, so that the first pin 161a is electrically isolated from the second pin 161b. In addition, the first pin 161a is electrically connected to the first plane 160a, and the second pin 161b is electrically connected to the second plane 160b. Consequently, the conductive pads 152 disposed on the power module 1 of the present invention and formed by SMT can be converted into pins 161a and 161b formed by through hole technology (THT), so as to increase the flexibly of converting the leading-out form of the power module 1, facilitate modular development, and also provide a low-cost way to meet the requirements of the leading-out forms from different clients.

Figure 7B:
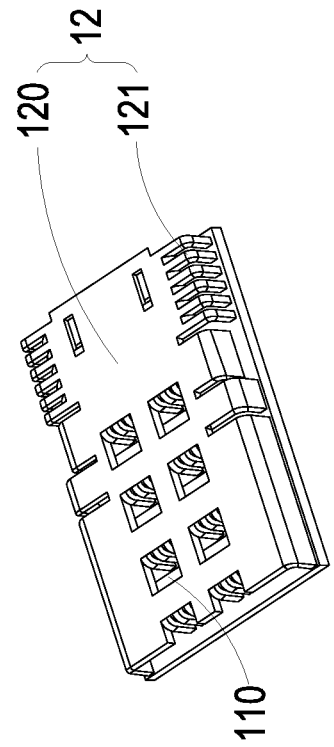
FIGS. 7A to 7D are schematic views illustrating an assembling flow of a power module according to a fourth preferred embodiment of the present invention.
Figure 7A:
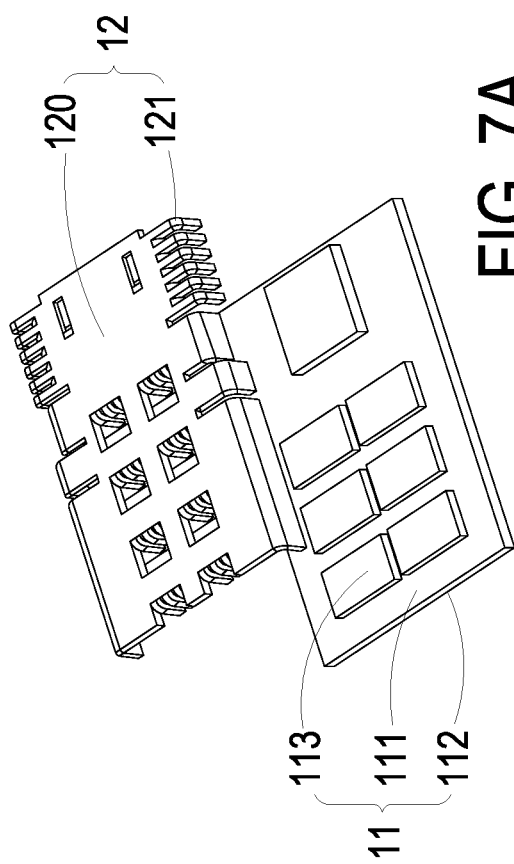
Figure 7D:
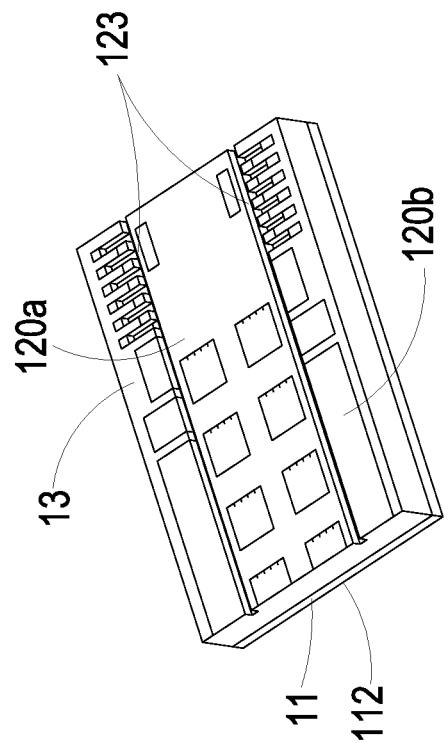
Figure 7C:
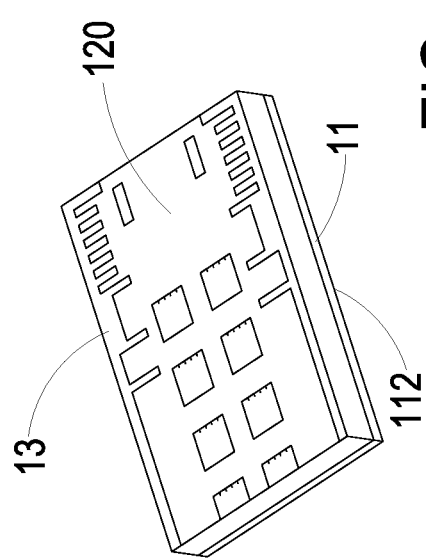
Figure 12:
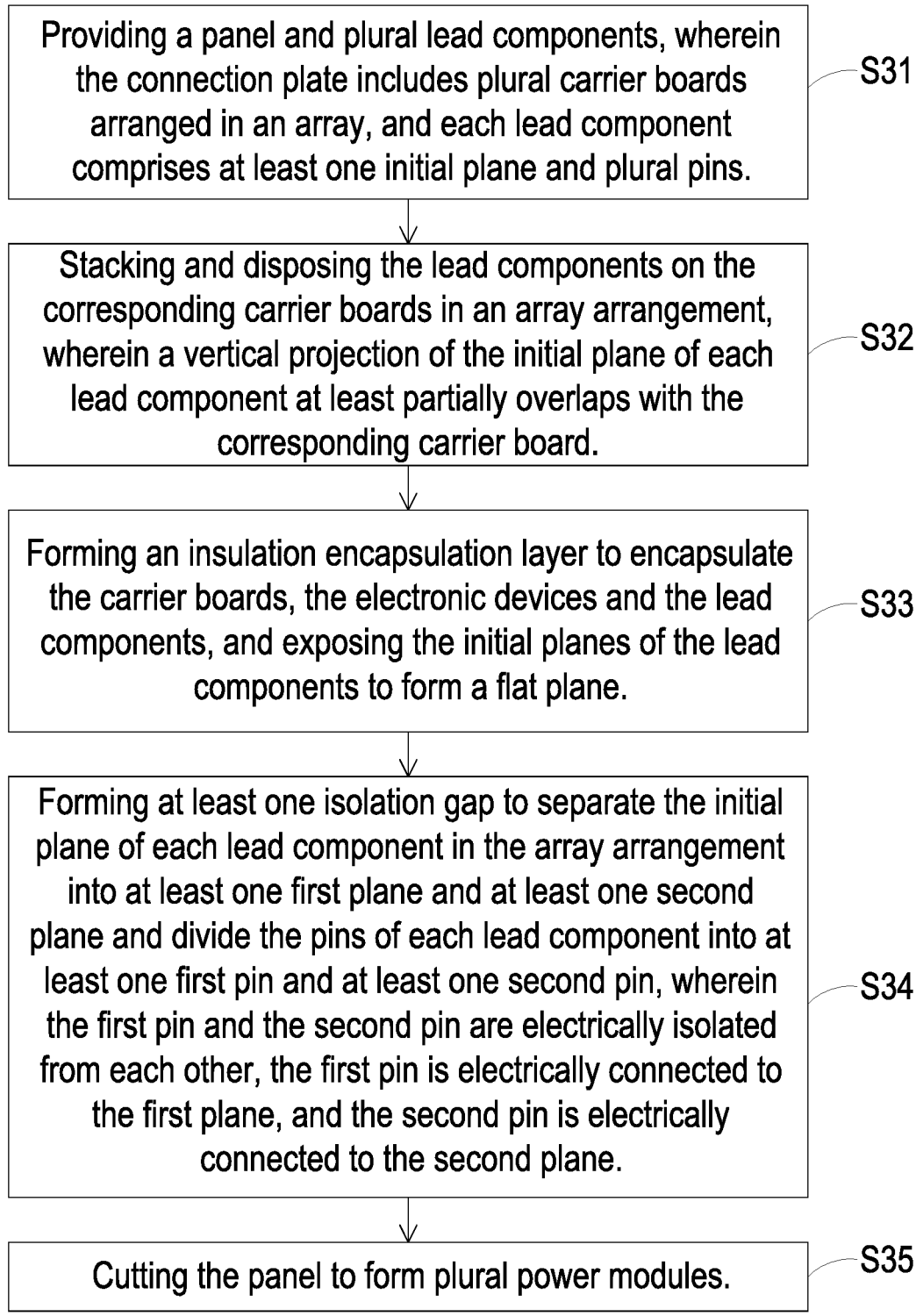
FIG. 12 is a flowchart showing a manufacturing method of a power module according to the seventh preferred embodiment of the present invention.

FIGS. 11A to 11F are schematic views illustrating an assembling flow of a power module according to a seventh preferred embodiment of the present invention. FIG. 12 is a flowchart showing a manufacturing method of a power module according to the seventh preferred embodiment of the present invention. In the embodiment, the structures, elements and functions of the power module 1 are similar to those of the power module 1 in FIGS. 7A to 7D, and are not redundantly described herein. Different from the embodiment of FIGS. 7A to 7D, the power module 1 of the present embodiment is panel-mode-manufactured by a panel 3. In the embodiment, firstly, as shown in the step S31 of FIG. 12, a panel 3 (see FIG. 11A) and plural lead components 12 are provided. The panel 3 includes plural carrier boards 11 and the carrier boards 11 are arranged in an array. Each lead component 12 includes at least one initial plane 120 and plural pins 121. At least one electronic device 113 for example but not limited to a power device is disposed on the carrier board 11. Then, as shown in the step S32 of FIG. 12, the lead components 12 are stacked and disposed on the corresponding carrier board 11 and arranged in an array (see FIG. 11B). The vertical projection of the initial plane 120 of each lead component 12 overlaps at least partially with the corresponding carrier board 11. Then, as shown in the step S33 of FIG. 12, an insulation encapsulation layer 13 is formed by filling molding material to encapsulate the carrier boards 11, the electronic devices 113 and the first lead components 12. The initial planes 120 of the first lead components 12 are exposed as more as possible, so as to form a flat plane (see FIG. 11C). The support strength and the protective performance of the structure can be enhanced by encapsulation. In an embodiment, the surface of the insulation encapsulation layer 13 can be polished or laser-deflashing so as to facilitate to form the flat plane, but it is not limited thereto. Afterward, as shown in the step S34 of FIG. 12, at least one isolation gap 123 (see FIG. 11 D) is formed, and each initial plane 120 of the lead components 12 arranged in the array is separated into at least one first plane 120a and at least one second plane 120b, and the pins 121 of each lead component 12 are divided into at least one first pin 121a and at least one second pin 121b, so that each first pin 121a is electrically isolated from each second pin 121b. Moreover, each first pin 121a is electrically connected to the first plane 120a, and each second pin 121b is electrically connected to the second plane 120b (see FIG. 11D). Finally, as shown in the step S35 of FIG. 12, plural power modules 1 (see FIG. 11E) can be formed easily by cutting the panel 3. Each power module 1 (see FIG. 11F) obtained by the foregoing manufacturing method is substantially the same as the power module 1 as shown in FIG. 7D. Comparing with the above embodiments, the power module 1 of the present embodiment is manufactured by mass production, so as to achieve the purposes of reducing the cost and improving the efficiency. It is noted that in the foregoing embodiments, the number and the array arrangement mode of the power modules 1 disposed on the panel 3 are only illustrative and adjustable according to the practical requirements. The present invention is not limited thereto, and are not redundantly described herein.

Figure 13C:
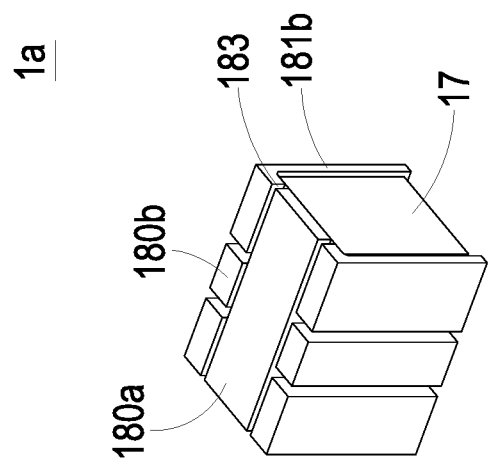
FIGS. 13A to 13C are schematic views illustrating an assembling flow of a power module according to an eighth preferred embodiment of the present invention.
Figure 13B:
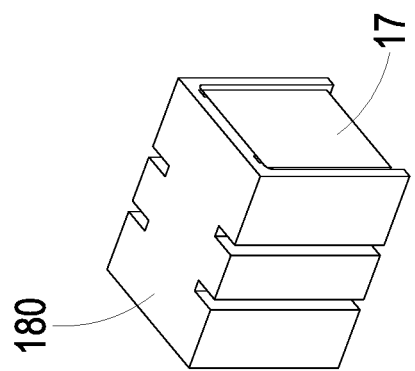
Figure 13A:
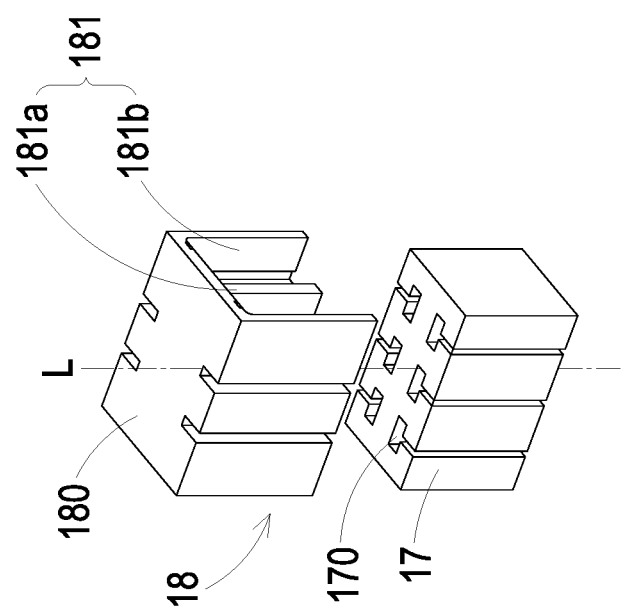

FIGS. 13A to 13C are schematic views illustrating an assembling flow of a power module according to an eighth preferred embodiment of the present invention. In the embodiment, the power module 1a is further applied to a magnetic component of the power module. In the embodiment, a magnetic core 17 and a lead component 18 are provided firstly. As shown in FIG. 13A, the magnetic core 17 serves as a carrier board and includes at least one window 170 passing through the magnetic core 17. The window 170 includes a passing-though line L vertical to the initial plane 180 of the lead component 18, and at least portion of the plural pins 181 pass through the corresponding window 170. Then, some pins 181 of the lead component 18 are served as the first pin 181a configured to plug into the corresponding window 170 of the magnetic core 17, and the initial plane 180 is adhered with the magnetic core 17 by an adhesive to form one piece as shown in FIG. 13B. Finally, at least one isolation gap 183 is formed on the initial plane 180 of the lead component 18 to separate the initial plane 180 of the lead component 18 into at least one first plane 180a and at least one second plane 180b as shown in FIG. 13C. Consequently, the pins 181 of the lead component 18 are divided into at least one first pin 181a and at least one second pin 181b (see FIG. 13A), so as to electrically isolate the first pin 181a from the second pin 181b. The first pin 181a is electrically connected to the first plane 180a, and the second pin 181b is electrically connected to the second plane 180b. In the embodiment, the first pins 181a and the first plane 180a are configured as the winding set of the magnetic component. The second pins 181b and the second plane portion 180b are served as a leading trace and a soldering pad. Compared with the previous embodiments, the step of encapsulation is omitted in this embodiment, so as to facilitate to integrate various pins and windings of the leading component, and accomplish a high-density integrated power module.

Figure 14C:
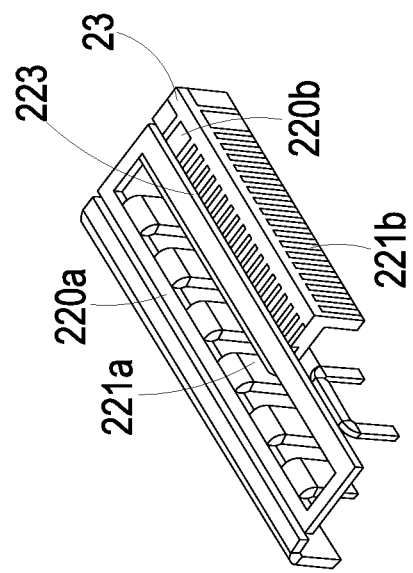
FIGS. 14A to 14C are schematic views illustrating a manufacturing process to prepare a lead component according to a preferred embodiment of the present invention.
Figure 14B:
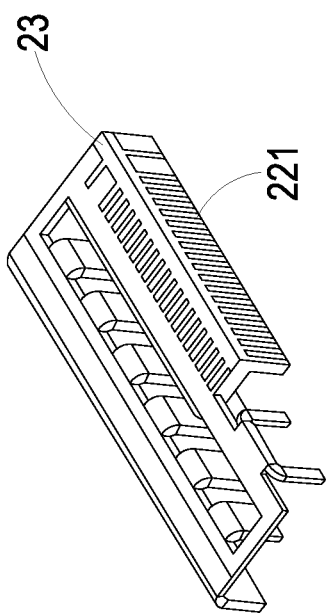
Figure 14A:
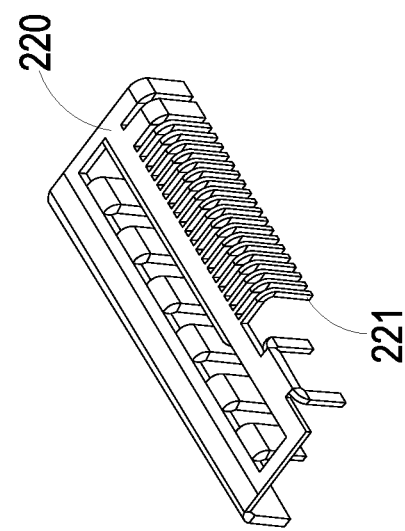

As described in the foregoing embodiments, it is understood that the lead components 12, 14, 16 and 18 of the present invention can be constructed from but not limited to the preformed conductive body. FIGS. 14A to 14C are schematic views illustrating a manufacturing process to prepare a lead component according to a preferred embodiment of the present invention. The preformed lead component (see FIG. 14A) can be provided with an encapsulation layer 23 by means of molding to encapsulate at least portion of the lead component, so as to enhance the mechanical strength of the lead component 22. As shown in FIG. 14B, the encapsulation layer 23 covers an area required to be cut in the subsequent step and exposes the portions of the initial plane 220 and the pins 221 to enhance the mechanical strength of the lead component 22 to facilitate the subsequent cutting process. The encapsulation layer 23 is used as a substrate herein. Then, an isolation gap 223, as shown in FIG. 14C, is formed by means of for example but not limited to mechanical cutting, milling or etching, so that the initial plane 220 is separated into at least one first plane 220a and at least one second plane 220b, and the pins 221 are divided into at least one first pin 221a and at least one second pin 221b. The first pin 221a is electrically isolated from the second pin 221b. The first pin 221a is electrically connected to the first plane 220a, and the second pin 221b is electrically connected to the second plane 220b. It is noted that, in some embodiments, the encapsulation layer 23 can further provide the mechanical strength for support and connection, so that the first pin 221a and the second pin 221b are electrically isolated from each other and mechanically connected with each other. In an embodiment, the combination of the lead component 22 and the aforementioned electronic device 113 is disposed on the other carrier board 11 (e.g., a circuit board), to obtain a simplified structure, reduce the damage to the electronic device during manufacturing, and improve the reliability of products. The present invention is not limited thereto, and are not redundantly described herein.

Figure 15D:
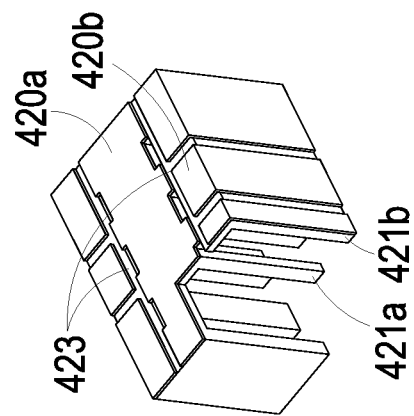
FIGS. 15A to 15D are schematic views illustrating another manufacturing process to prepare a lead component according to a preferred embodiment of the present invention.
Figure 15C:
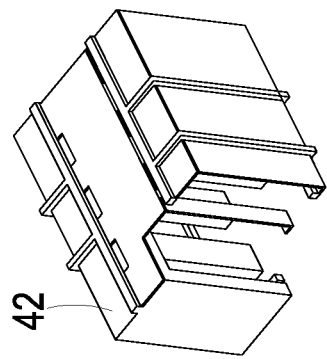
Figure 15B:
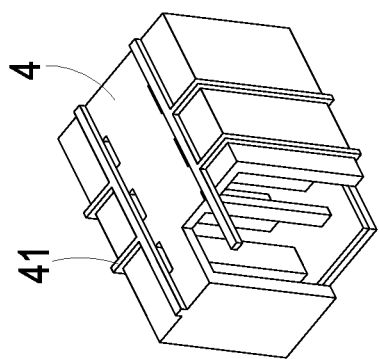
Figure 15A:
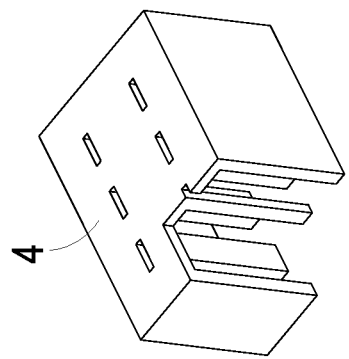

FIGS. 15A to 15D are schematic views illustrating another manufacturing process to prepare a lead component according to a preferred embodiment of the present invention. In the embodiment, an insulation body 4 is provided firstly, as shown in FIG. 15A. Then, at least one strip 41, which is easily detached from the insulation body 4, is formed on the insulation body 4, as shown in FIG. 15B. Thereafter, a surface plating is performed on the insulation body 4 and the strip 41 to form an initial plane and obtain a conductive body 42, as shown in FIG. 15C. Finally, the strip 41 is detached, so that at least one isolation gap 423 is formed on the original preformed conductive body 42, as shown in FIG. 15D. Namely, the first plane 420a and the second plane 420b electrically isolated from each other, and the at least one first pin 421a and the at least one second pin 421b electrically isolated from each other, are constructed from the original conductive body 42. The first pin 421a is electrically connected to the first plane 420a, and the second pin 421b is electrically connected to the second plane 420b.

Figure 16D:
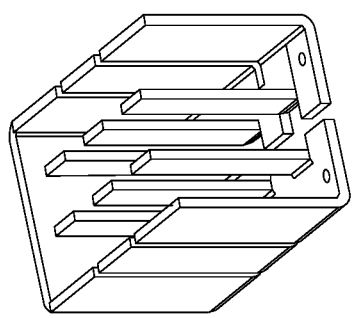
FIGS. 16A to 16D are schematic views illustrating a manufacturing process of the lead component according to the eighth preferred embodiment of the present invention.
Figure 16C:
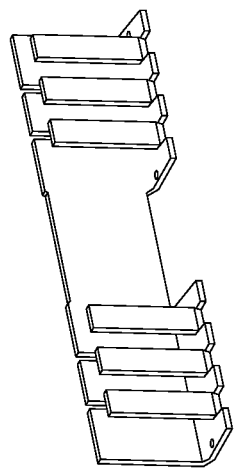
Figure 16B:
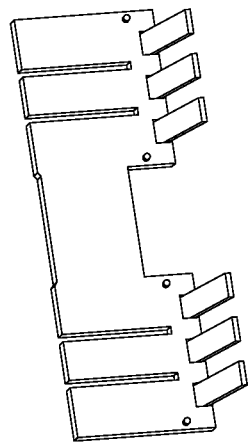
Figure 16A:
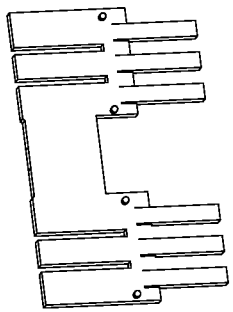

FIGS. 16A to 16D are schematic views illustrating a manufacturing process of the lead component according to the eighth preferred embodiment of the present invention. In the embodiment, as shown in FIG. 16A, a sheet-shaped conductive body is provided firstly. Then, the lead component 18 of the foregoing eighth embodiment is obtained by stamping and bending process as shown in FIGS. 16B to 16D.

Figure 17:
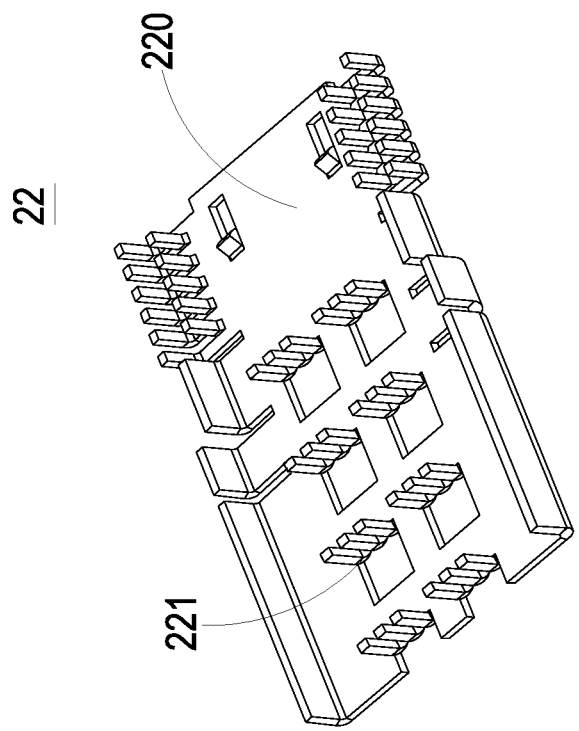
FIGS. 17 to 21 are schematic views illustrating a conductive body of a leading component according to different embodiments of the present invention.
Figure 18:
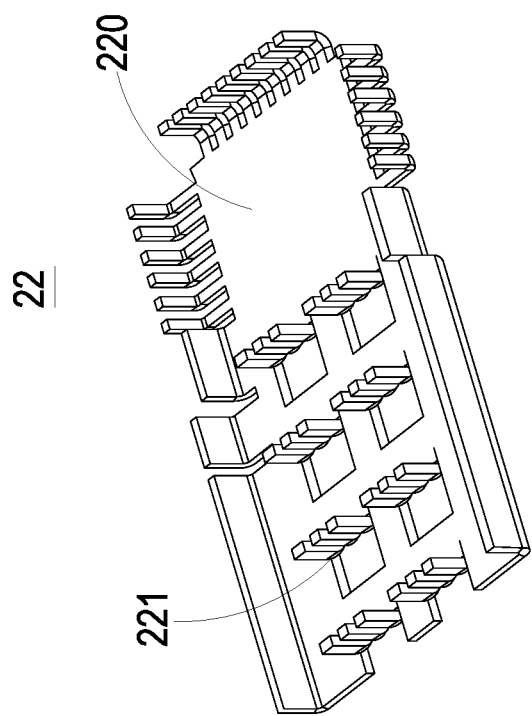
Figure 20:
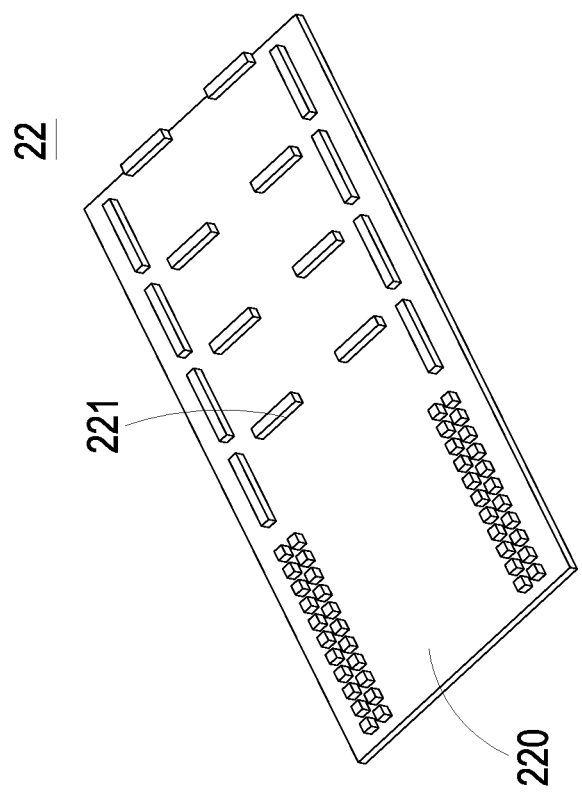
Figure 19:
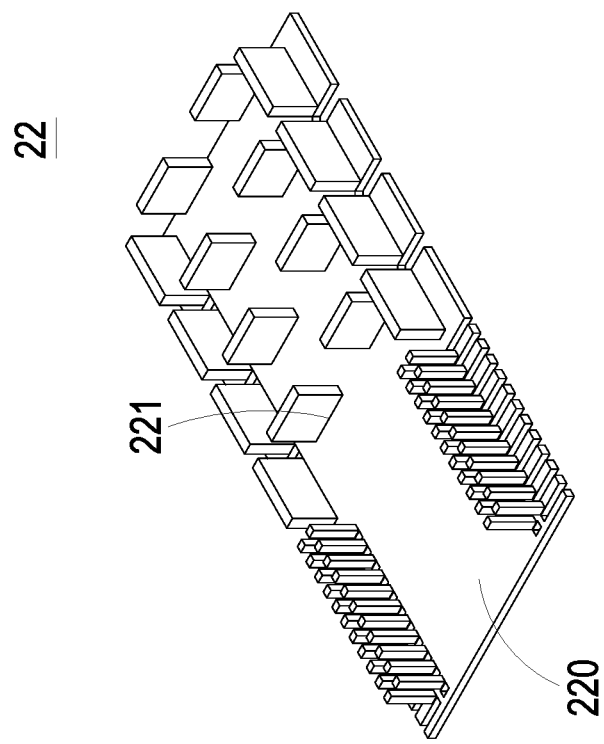
Figure 21:
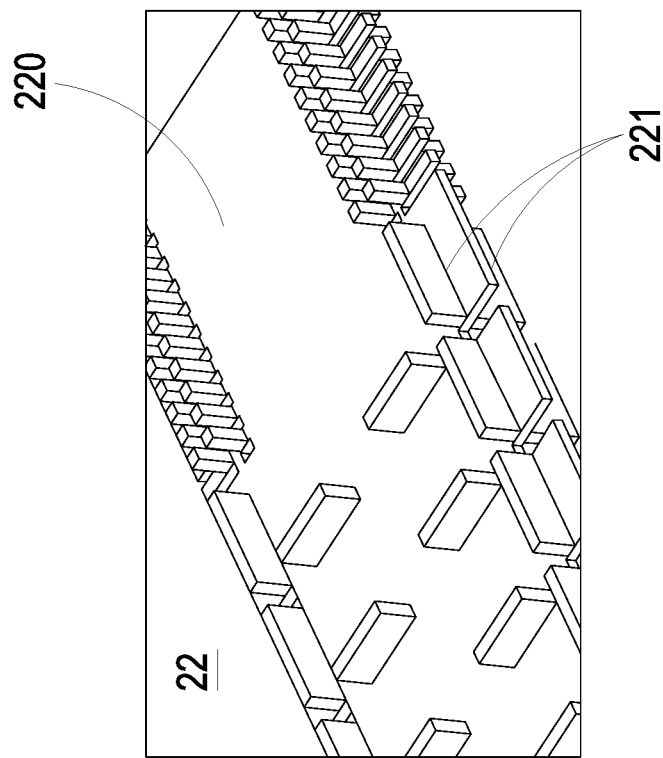

FIGS. 17 to 21 are schematic views illustrating a conductive body of a leading component according to different embodiments of the present invention. The conductive bodies of the lead components 22 in FIGS. 17 and 18 are obtained by mechanical stamping. The conductive body of the lead component 22 in FIG. 19 can be produced by for example but not limited to a die casting process, a forging process, a metal powder injection molding process, or a welding process. The conductive body of the lead component 22 in FIG. 20 is formed by etching. The conductive body of the lead component 22 in FIG. 21 is provided with plural pins 221 disposed on the upper side and the lower side of the initial plane 220, respectively, so as to increase the lead modulation ability of the lead component 22. It is noted that the lead components 22 of the present invention may be fabricated in a variety of processes, so that the application field of the lead component 22 is wider and it is advantage to strike a balance between meeting the application requirements and controlling the cost.

Figure 22:
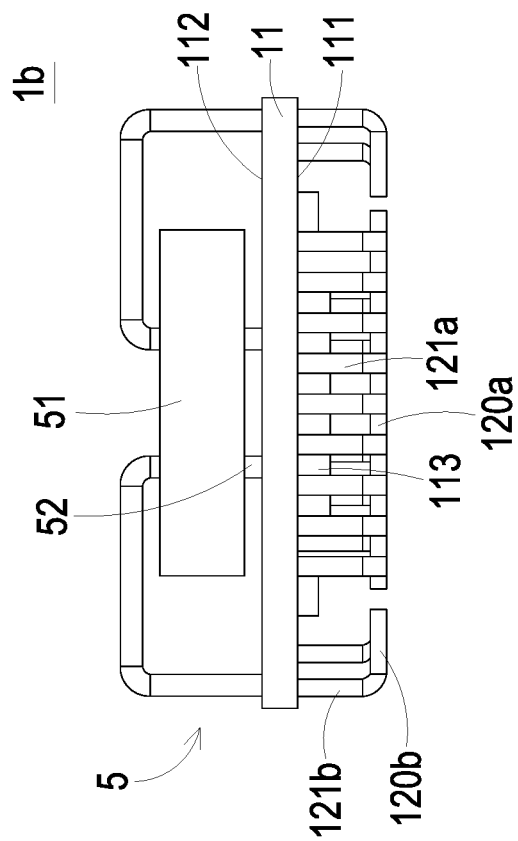
FIG. 22 is a side view illustrating a power module according to a ninth preferred embodiment of the present invention.
Figure 23:
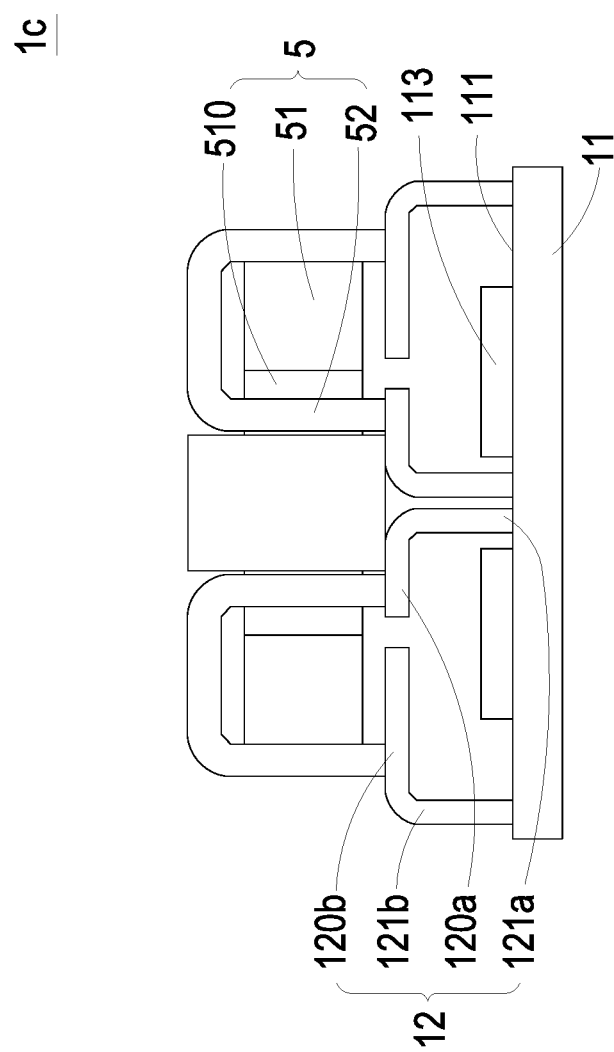
FIG. 23 is a cross-sectional views illustrating a power module according to a tenth preferred embodiment of the present invention.

FIG. 22 is a side view illustrating a power module according to a ninth preferred embodiment of the present invention. In the embodiment, the structures, elements and functions of the power module 1b are similar to those of the power module 1 in FIGS. 1A to 1C, and are not redundantly described herein. Different from the embodiment of FIGS. 1A to 1C, the power module 1b of the present embodiment is further provided with a magnetic component 5 disposed and stacked relative to the other second surface 112 of the carrier board 11. The magnetic component 5 includes a magnetic core 51 and a winding set 52 partially passing through the magnetic core 51. In an embodiment, the magnetic component 5 is constructed as the same as the embodiment of FIGS. 13A to 13C, and the magnetic component 5 is disposed and stacked relative to the second surface 112 of the carrier board 11, so as to accomplish the power module 1b. FIG. 23 is a cross-sectional views illustrating a power module according to a tenth preferred embodiment of the present invention. In the embodiment, the structures, elements and functions of the power module 1c are similar to those of the power module 1b in FIG. 22, and are not redundantly described herein. Different from the power module 1b of FIG. 22, the magnetic component 5 of the power module 1c is directly stacked and disposed on the lead component 12, and portion of the winding set 52 passes through the window 510 and is connected to the first plane 120a, so as to accomplish a complete power module 1c. According to the above embodiments, the power modules 1, 1a, 1b, and 1c having the lead component 12 can be provided with the carrier board, the magnetic component and the electronic device stacked relative to a vertical projection of a plane, so as to construct a highly integrated power modules 1, 1a, 1b, and 1c.

In summary, the present disclosure provides a power module having a lead component and a manufacturing method thereof. The lead component is disposed on the carrier board, and the magnetic component and electronic device are vertically stacked relative to the lead component to accomplish a high-density integration of the power module and reduce the footprint and the entire volume of the power module effectively. In addition, the lead component provides not only the leading and pad functions to reduce the interference caused by the trace of the carrier board, but also the mechanical structural supporting function for the power module, to simplify the manufacturing process of the power module and improve the packaged structure of the power module. In addition, by means of cutting the lead component to form an electrical isolation, the lead component provides a structure for the winding of the magnetic component and another structure for the pin of the power module, so as to accomplish a high-density integration of the power module and reduce the footprint and the entire volume of the power module effectively. The magnetic component includes a passing-through window disposed between the top and the bottom surfaces thereof, so that the winding of the magnetic component can be electrically connected to the electronic device on the carrier board in the shortest distance. Consequently, the conducting circuit is improved effectively and the conduction loss is reduced. On the other hand, the structure of the lead component is compact and the power modules having different sizes can be encapsulated by a molding tool having a common molding chamber, so as to save the costs of molding tools and the production effectively. In addition, plural lead components can be integrated for facilitating to perform the molding processing, and plural power modules can be obtained by performing at least one cutting process. Consequently, the production process is simplified, the production cost is reduced, and it is easy to achieve mass production.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a power module, comprising:
   (a) providing a carrier board and at least one lead component, wherein the lead component comprises at least one initial plane and plural pins, and the step (a) further comprises a step of (a0) providing a panel and plural lead components, wherein the panel includes plural carrier boards arranged in an array, and each lead component comprise the at least one initial plane and the plural pins;
   (b) stacking and disposing the lead component on the carrier board, wherein a vertical projection of the initial plane at least partially overlaps with the carrier board; and
   (c) forming at least one isolation gap to separate the initial plane into a first plane and a second plane and divide the pins into at least one first pin and at least one second pin, wherein the first pin and the second pin are electrically isolated from each other, the first pin is electrically connected to the first plane, and the second pin is electrically connected to the second plane.

2. The manufacturing method according to claim 1, wherein the carrier board is a magnetic core, wherein the magnetic core comprises at least one window passing therethrough, the window includes a passing-through line vertical to the initial plane, and the first pin passes through the window.

3. The manufacturing method according to claim 1, wherein the step (b) is implemented by means of welding, plugging, plastic packaging, or glue-bonding.

4. The manufacturing method according to claim 1, wherein in the step (a), the carrier board further comprises an electronic device disposed thereon.

5. The manufacturing method according to claim wherein the step (b) further comprises a step of:
   (b1) forming an insulation encapsulation layer to encapsulate the carrier board, the electronic device and the lead component.

6. The manufacturing method according to claim 5, wherein the step (b) further comprises a step of:
   (b2) at least partially polishing or laser-engraving the insulation encapsulation layer to form a flat plane, wherein the flat plane includes the initial plane of the lead component.

7. The manufacturing method according to claim 1, wherein the step (a) further comprises pretreatment steps of providing and bending a preformed lead component to form the lead component including the pins and the initial plane.

8. The manufacturing method according to claim 1, wherein the step (b) further comprises a step of (b0) stacking and disposing the lead components on the corresponding carrier boards in an array arrangement, wherein the vertical projection of the initial plane of each the lead component at least partially overlaps with the corresponding carrier board.

9. The manufacturing method according to claim 8, wherein the step (b0) is implemented by means of welding, plugging, plastic packaging, or glue-bonding.

10. The manufacturing method according to claim 8, wherein the step (b0) further comprises a step of:
    (b01) forming an insulation encapsulation layer to encapsulate the plural carrier boards, the plural electronic devices and the plural lead components.

11. The manufacturing method according to claim 10, wherein the step (b0) further comprises a step of:
    (b02) at least partially polishing or laser-engraving the insulation encapsulation layer to form a flat plane, wherein the flat plane includes the initial plane of each the lead component.

12. The manufacturing method according to claim 8, wherein the step (c) comprises a step of (c0) forming the at least one isolation gap to separate the initial plane of each lead component in the array arrangement into the at least one first plane and the at least one second plane and divide the pins of each lead component into the at least one first pin and the at least one second pin.

13. The manufacturing method according to claim 12, further comprising a step of (d) cutting the panel to form plural power modules.

14. The manufacturing method according to claim 1, comprising:
    (b0) stacking and disposing the lead components on the corresponding carrier boards in an array arrangement, wherein the vertical projection of the initial plane of each the lead component at least partially overlaps with the corresponding carrier board;
    (c0) forming the at least one isolation gap to separate the initial plane of each lead component in the array arrangement into the at least one first plane and the at least one second plane and divide the pins of each lead component into the at least one first pin and the at least one second pin, wherein the first pin and the second pin are electrically isolated from each other, the first pin is electrically connected to the first plane, and the second pin is electrically connected to the second plane; and
    (d0) cutting the panel to form plural power modules.

15. The manufacturing method according to claim 14, wherein in the step (a0), each carrier board further comprises an electronic device disposed thereon.

16. The manufacturing method according to claim 1, wherein the initial plane includes at least one pad, and a vertical projection at least partially overlapping with the carrier board, wherein the at least one first pin is electrically connected to the carrier board, and the first pin is vertical to the initial plane, wherein the at least one second pin is electrically connected to the carrier board, and the second pin is vertical to the initial plane.

17. The manufacturing method according to claim 16, wherein the initial plane comprises a vertical projection overlapping with a maximum circular envelope formed by the first pin and the second pin.

18. The manufacturing method according to claim 16, wherein the carrier board is a magnetic core, wherein the magnetic core comprises at least one window passing therethrough, the window includes a passing-through line vertical to the initial plane, and the first pin passes through the window.

19. The manufacturing method according to claim 16, wherein the lead component is preformed by means of metal plating on an insulation body, metal-sheet stamping, metal forging, metal welding, metal injection molding or etching.

* * * * *